(12) United States Patent  (10) Patent No.: US 6,924,524 B2
Lee  (45) Date of Patent: Aug. 2, 2005

(54) INTEGRATED CIRCUIT MEMORY DEVICES

(75) Inventor: Jae-goo Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/756,543

(22) Filed: Jan. 13, 2004

(65) Prior Publication Data

US 2004/0147073 A1 Jul. 29, 2004

Related U.S. Application Data

(62) Division of application No. 10/100,719, filed on Mar. 19, 2002, now Pat. No. 6,709,915.

(30) Foreign Application Priority Data

Jun. 1, 2001 (KR) ........................................ 2001-30772

(51) Int. Cl.[7] ...................... H01L 27/108; H01L 29/94; H01L 31/113; H01L 31/119
(52) U.S. Cl. .......................... 257/296; 257/68; 257/906
(58) Field of Search ................................. 257/296, 300, 257/306, 308, 310, 347, 906, 908

(56) References Cited

U.S. PATENT DOCUMENTS

| | | | | | |
|---|---|---|---|---|---|
| 5,604,365 | A | * | 2/1997 | Kajigaya et al. | ............. 257/296 |
| 5,629,539 | A | * | 5/1997 | Aoki et al. | ................... 257/306 |
| 5,744,833 | A | | 4/1998 | Chae | ............................ 257/308 |
| 5,879,982 | A | | 3/1999 | Park et al. | .................... 438/241 |
| 5,972,747 | A | * | 10/1999 | Hong | .......................... 438/253 |
| 6,037,215 | A | | 3/2000 | Lee et al. | ..................... 438/253 |
| 6,291,847 | B1 | * | 9/2001 | Ohyu et al. | .................. 257/306 |
| 6,400,628 | B2 | * | 6/2002 | Dosaka et al. | ............... 365/210 |
| 6,555,481 | B2 | * | 4/2003 | Nakamura | .................... 438/734 |

* cited by examiner

Primary Examiner—David Nhu
(74) Attorney, Agent, or Firm—Myers Bigel Sibley & Sajovec, P.A.

(57) ABSTRACT

An integrated circuit memory device and a method of manufacturing the same are provided. A plurality of word line structures are formed on predetermined portions of a semiconductor substrate on which an active region is defined. Word line contact plugs are formed between the word line structures on the active region. An insulating layer is deposited on the semiconductor substrate on which the word line contact plugs are formed. Bit line structures are formed on the insulating layer so as to be in electrical contact with some of the word line contact plugs. An interlayer insulating layer is deposited on the bit line structures. An etch stopper is formed on the interlayer insulating layer. Storage node contact holes are formed by etching predetermined portions of the interlayer insulating layer and the etch stopper to expose word line contact plugs not yet exposed. Storage node contact plugs are formed so as to fill the storage node contact holes. Storage node electrodes are formed to be in electrical contact with the storage node contact plugs. The remaining etch stopper and the interlayer insulating layer between the storage node contact plugs are selectively removed. A dielectric layer is formed on the exposed surfaces of the storage node contact plugs and the storage node electrodes. A plate electrode is formed on the dielectric layer and extending between the storage node contact plugs.

14 Claims, 7 Drawing Sheets

X DIRECTION

Y DIRECTION

INTEGRATED CIRCUIT MEMORY DEVICES

RELATED APPLICATION

This application is a divisional of U.S. application Ser. No. 10/100,719, filed Mar. 19, 2002 now U.S. Pat. No. 6,709,915, which claims priority from Korean Patent Application No. 2001-30772, filed on Jun. 1, 2001, the contents of each of which are herein incorporated by reference in their entirety.

FIELD OF THE INVENTION

The present invention relates to an integrated circuit memory device and a method of fabricating the same, and more particularly, to an integrated circuit memory device which is capable of enhancing the capacitance of a capacitor without increasing the height of the capacitor and a method of fabricating the same.

BACKGROUND OF THE INVENTION

As the integration density of integrated circuit devices, increases, the area occupied by a unit cell continues to decrease. Since the driving capability of integrated circuit devices, such as dynamic random access memories (DRAM), is strongly dependent on the capacitance of a capacitor, a variety of attempts for increasing the capacitance of a capacitor have been carried out, irrespective of the decrease of the area occupied by the capacitor. Accordingly, in order to increase the capacitance of a capacitor by increasing the effective area of the capacitor, capacitors have been formed to have a three-dimensional structure, such as a concave shape, a cylinder shape, a fin shape, or a box shape.

Hereinafter, a method of fabricating a conventional integrated circuit memory device including a concave-shaped storage node electrode will be described with reference to FIGS. 1A through 1C. In FIGS. 1A through 1C, the drawings indicated by "X direction" are cross-sectional views of a semiconductor substrate taken along a direction parallel to word lines, and the drawings indicated by "Y direction" are cross-sectional views of a semiconductor substrate taken along a direction parallel to bit lines.

Referring to FIG. 1A, word line structures 15 are formed on a semiconductor substrate 10, on which an isolation layer 11 is formed, by a well-known method. Here, each of the word line structures 15 includes a gate insulating layer 12, a gate electrode 13 on the gate insulating layer 12, and an insulating material 14 covering the top surface and sides of the gate electrode 13. Contact plugs 16 are formed on the semiconductor substrate 10 between the word line structures 15 in a self-aligned manner, and then a first interlayer insulating layer 17 is formed on the semiconductor substrate 10 on which the contact plugs 16 are formed.

Next, a second interlayer insulating layer 18 is formed on the contact plugs 16 and the first interlayer insulating layer 17, and then is selectively etched to expose some of the contact plugs 16. Next, bit line structures 21 are formed on the second interlayer insulating layer 18, in contact with the exposed contact plugs. Here, each of the bit line structures 21 includes a bit line 19 and an insulating material 20 covering the top surface and sides of the bit line 19. A third interlayer insulating layer 22 and an etch stopper 23 are sequentially formed on the semiconductor substrate 10 on which the bit line structures 21 are formed.

Referring to FIG. 1B, predetermined portions of the etch stopper 23 and the third interlayer insulating layer 22 are etched to expose selected portions of the contact plugs 16, thereby forming storage node contact holes 24. Next, storage node contact plugs 25 are formed in the storage node contact holes 24 by a well-known method.

Next, as shown in FIG. 1C, storage node electrodes 26 are formed to be in contact with exposed storage node contact plugs 25 by a well-known method. A dielectric layer 27 is deposited along the surfaces of the storage node electrodes 26, and then a plate electrode 28 is formed on the semiconductor substrate 10 on which the dielectric layer 27 is formed.

However, the conventional integrated circuit memory device has the following problems. Firstly, as the integration density of integrated circuit memory devices increases, the pitch size of interconnections typically decreases proportionally. If the pitch size of interconnections is reduced to 0.21 Φm or less, a capacitance no less than 20 fF per a unit cell is desirable. In order to obtain capacitance having such a value, it is desirable that the height of each storage node electrode be no less than 10,000 Δ.

However, if the height of storage node electrodes is increased in order to obtain a high capacitance, the aspect ratio of a cell region can considerably increase, causing a great step difference between the cell region at which the storage node electrodes will be formed and a peripheral region at which other circuit devices will be formed. In addition, if even a slight physical impact is applied to the storage node electrodes, the storage node electrodes (capacitors) may be tilted to one side or may be broken, and thus multi-bit or twin-bit failure occurring when the upper parts of adjacent capacitors are contacted with each other may be caused.

SUMMARY OF THE INVENTION

According to some embodiments of the present invention, an integrated circuit memory device includes a plurality of word line structures formed on a semiconductor substrate. Contact plugs are disposed between adjacent word line structures. Bit line structures are formed to be in electrical contact with predetermined contact plugs selected among the contact plugs. An interlayer insulating layer insulates the contact plugs from one another and insulates non-selected contact plugs from the bit line structures. Storage node contact plugs are formed to be in electrical contact with the non-selected contact plugs. Storage node electrodes are formed on the storage node contact plugs. A dielectric layer is deposited on the surfaces of the storage node contact plugs and the storage node electrodes. A plate electrode is formed on the surface of the dielectric layer and extends between the storage node contact plugs, and more preferably between lower portions of the storage node contact plugs. The surface area of the interface between the plate electrode and the combination of storage node contact plugs and storage node electrodes is increased by having the plate electrode extending between the storage note contact plugs. For a capacitor formed in this fashion the increased surface area can provide increased capacitance while avoiding increasing the size of the capacitor. The lower portions of the storage node contact plugs are fit into spaces between the bit line structures so as to be supported by the bit line structures.

The word line structures each include a gate electrode, a gate insulating layer insulating the gate electrode from the semiconductor substrate, and an insulating material covering the top surface and sides of the gate electrode, and the bit line structures each include a bit line and an insulating layer covering the top surface and sides of the bit line.

According to a second aspect of the present invention, there is provided a method for manufacturing an integrated circuit memory device. A plurality of word line structures are formed on predetermined portions of a semiconductor substrate on which an active region is defined. Contact plugs are formed between the word line structures on the active region. An insulating layer is formed on the semiconductor substrate on which the contact plugs are formed. Bit line structures are formed on the insulating layer so as to be in electrical contact with predetermined contact plugs selected from among the contact plugs. An interlayer insulating layer is deposited on the bit line structures. An etch stopper is formed on the interlayer insulating layer. Storage node contact holes are formed by etching predetermined portions of the interlayer insulating layer and the etch stopper to expose non-selected contact plugs. Storage node contact plugs are formed to in the storage node contact holes. Storage node electrodes are formed to be in electrical contact with the storage node contact plugs. The remaining etch stopper is removed to expose surfaces on upper portions of the storage node contact plugs. A dielectric layer is formed on the exposed surfaces of the storage node contact plugs and the storage node electrodes. A plate electrode is formed on the dielectric layer. In further embodiments, the interlayer insulating layer between the storage node contact plugs is selectively removed to expose further surfaces of the storage node contact plugs. In this manner, the surface area of the interface between the plate electrode and the storage node contact plugs and storage node electrodes is increased.

The step of forming the word line structures, a gate insulating layer is formed on the semiconductor substrate, and a conductive layer is formed on the gate insulating layer. Then, a hard mask layer of an insulating material is formed on the conductive layer. Next, the hard mask layer, the conductive layer, and the gate insulating layer are patterned to have a predetermined size. Next, spacers are formed at the sides of the patterned hard mask layer, the patterned conductive layer, and the patterned gate insulating layer.

In the step of forming the contact plugs between the word line structures on the active region, an oxide layer for insulating contact plugs is deposited on the semiconductor substrate on which the word line structures are formed. Predetermined portions of the oxide layer for insulating a contact plug are etched to expose the active region. Contact plugs are formed on the exposed active region between the word line structures.

In the step of forming the bit line structures, the conductive layer is formed on the insulating layer. A bit line insulating layer of a material having a different etching selectivity from that of the interlayer insulating layer is formed on the conductive layer. Predetermined portions of the bit line insulating layer and the conductive layer are patterned. Spacers of a material having a different etching selectivity from that of the interlayer insulating layer are formed at the sides of the patterned bit line insulating layer and the patterned conductive layer.

In the step of forming the storage node contact plugs, a conductive layer is formed on the interlayer insulating layer in the storage node contact holes. The storage node contact holes are filled with the conductive layer and the conductive layer is mechanically polished until the etch stopper is exposed.

The etch stopper may be formed of a SiN layer or a SiON layer. The remaining etch stopper may be selectively removed by wet etching without substantially affecting the storage node electrodes and the storage node contact plugs.

The interlayer insulating layer existing between the storage node contact plugs may be selectively removed by wet etching without substantially affecting the storage node electrodes and the storage node contact plugs.

In the present invention, an etch stopper and an interlayer insulating layer between lower electrodes which are each comprised of a storage node electrode and a storage node contact plug are selectively removed. Then, an insulating layer is formed on the exposed surfaces of the lower electrodes, and a plate electrode is formed on the insulating layer.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 1A:
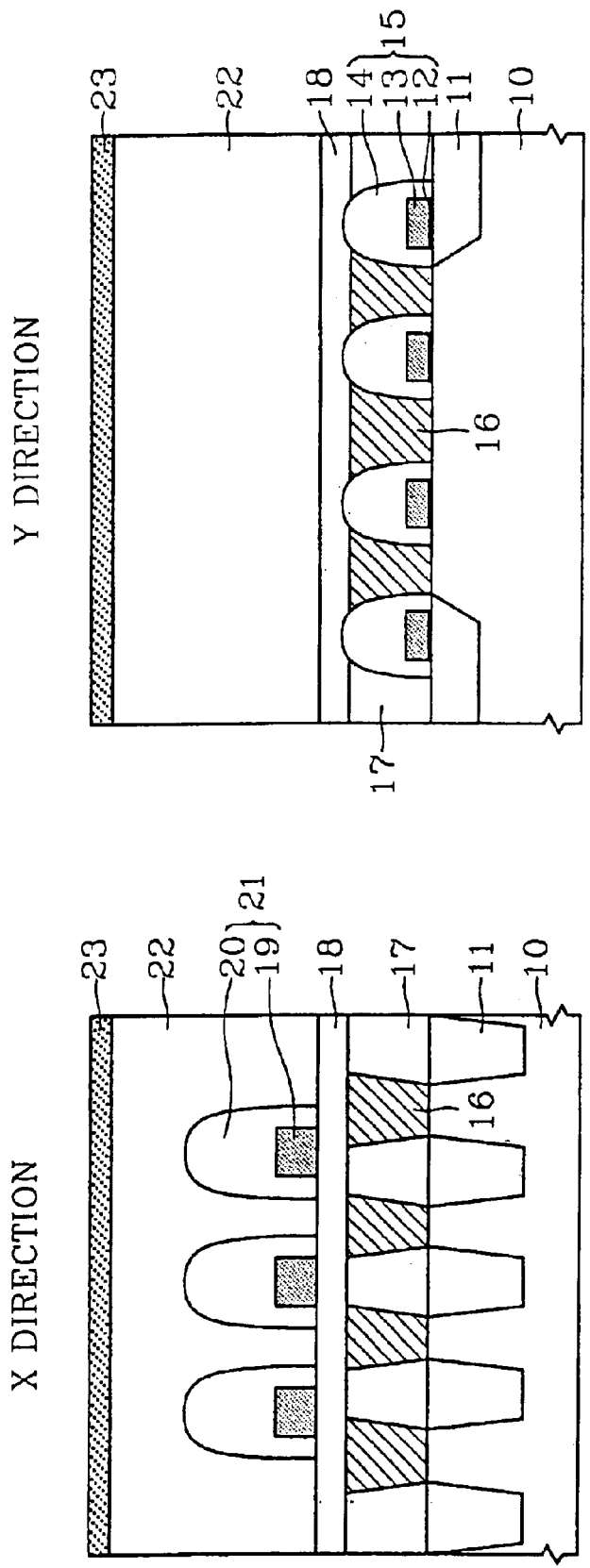
FIGS. 1A through 1C are cross-sectional views illustrating a prior art method for manufacturing a conventional integrated circuit memory device.
Figure 1B:
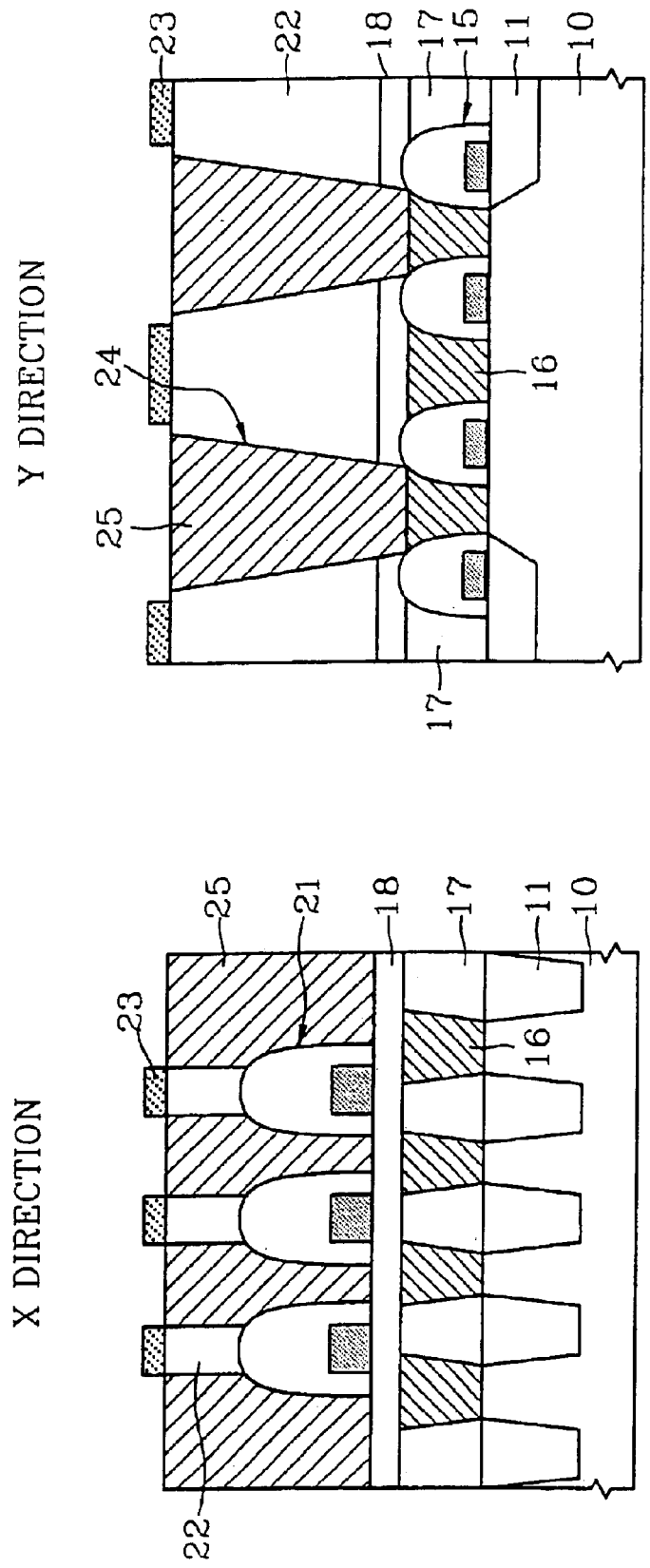
Figure 1C:
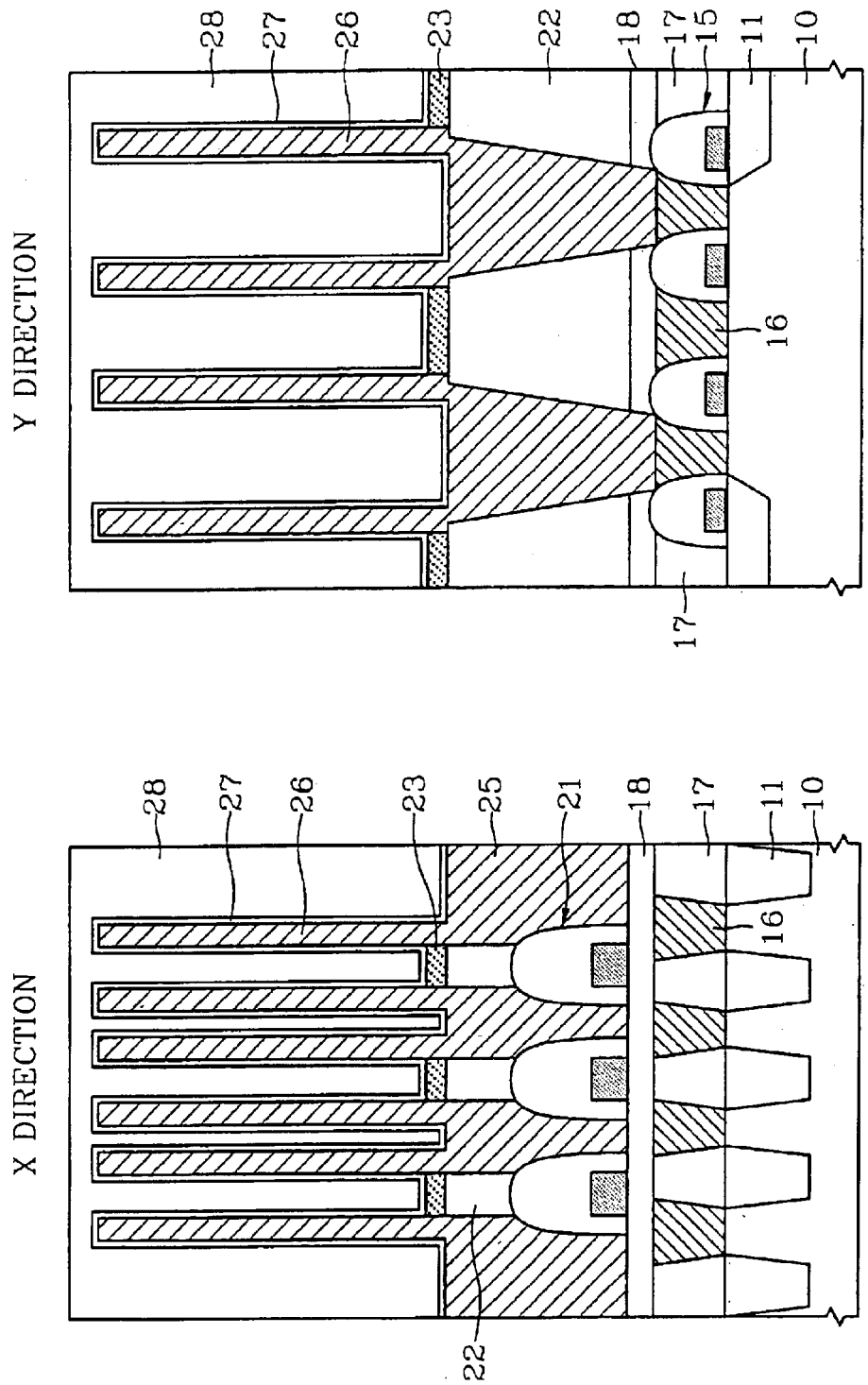

The present invention will now be described more fully with reference to the accompanying drawings, in which a preferred embodiment of the invention is shown. This invention may, however, be embodied in many different forms and should not be construed as being limited to the embodiment set forth herein. Rather, this embodiment is provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present.

FIGS. 2A through 2D illustrate a method of fabricating an integrated circuit memory device according to an embodiment of the present invention. In FIGS. 2A through 2D, the drawings indicated by "X direction" are cross-sectional views of a semiconductor substrate taken along a direction parallel to word lines, and the drawings indicated by "Y direction" are cross-sectional views of a semiconductor substrate taken along a direction parallel to bit lines.

Figure 2A:
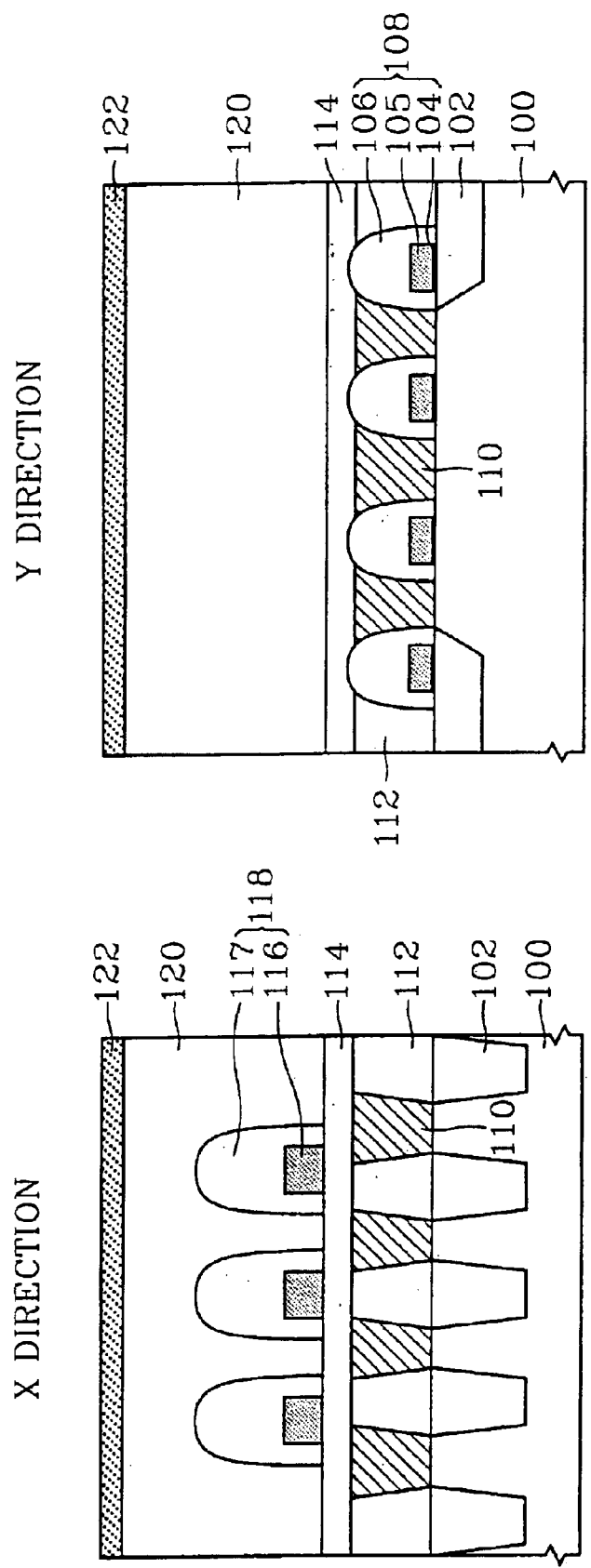
FIGS. 2A through 2D are cross-sectional views illustrating an integrated circuit memory device according to an embodiment of the present invention and a method of fabricating the same.

Referring to FIG. 2A, an isolation layer 102 is formed on predetermined portions of a semiconductor substrate 100 formed of a conductive material, such as silicon, thereby defining an active region. In the present embodiment, an isolation layer formed in a shallow trench isolation manner may be used as the isolation layer 102. A plurality of word line structures 108 are formed on the semiconductor substrate 100 on which the active region is defined. Here, each of the word line structures 108 includes a gate insulating layer 104, a gate electrode 105 on the gate insulating layer 104, and an insulating material 106 covering the top surface and sides of the gate electrode 105. A method for manufacturing the plurality of word line structures 108 is as follows. The gate insulating layer 104 and a conductive layer and a hard mask layer are sequentially deposited on the semiconductor substrate 100 and are patterned to form a word line's shape. Then, spacers (not shown) are formed at either side of the patterned hard mask layer, conductive layer and gate insulating layer 104. Here, the patterned conductive layer becomes the gate electrode 105, and the hard mask layer and the spacers form the insulating material 106 covering the top surface and sides of the gate electrode 105. The insulating material 106 may be formed of a material, such as silicon nitride (SiN or SiON), having a different etching selectivity from that of a silicon oxide layer forming an interlayer insulating layer so that contact plugs can be formed in a self-aligned manner. Impurities are doped in the active region between the adjacent word line structures 108, thereby forming a source region and a drain region. Next, a first interlayer insulating layer 112 is deposited on the semiconductor substrate 100 on which the word line structures 108 are formed. Here, the first interlayer insulating layer may be formed of a silicon oxide-based insulating layer and is deposited to a sufficient thickness to fill spaces between the word line structures 108. Next, predetermined portions of the first interlayer insulating layer 112 are etched to expose the active region in a cell region.

Next, a plug conductive layer (or a conductive layer for a plug), for example, a doped polysilicon layer, is deposited so as to sufficiently fill the exposed spaces between the word line structures 108 and then is chemically and mechanically polished until the surfaces of the word line structures 108 are exposed, thereby forming contact plugs 110 between the adjacent word line structures 108.

A second interlayer insulating layer 114 is formed on the first interlayer insulating layer 112 and the contact plugs 110. The second interlayer insulating layer 114 may be formed of a silicon oxide-based insulating layer or a silicon nitride-based insulating layer.

Predetermined portions of the second interlayer insulating layer 114 are etched to expose some of the contact plugs 110, that is, contact plugs (not shown) in contact with the drain region, thereby forming bit line structures 118 to be in electrical contact with the exposed contact plugs. Here, each of the bit line structures 118 includes a bit line 116 and an insulating material 117 covering the top surface and sides of the bit line 116. The insulating material 117 may be formed of a material having a different etching selectivity from that of the silicon oxide layer of the first interlayer insulating layer 112, such as a silicon nitride layer. A method for manufacturing the bit line structures 118 is as follows. A conductive layer and an etching stopping insulating layer are sequentially deposited on the second interlayer insulating layer 114 and then are patterned to form a predetermined shape. Next, spacers are formed at either side of the patterned etching stopping insulating layer and conductive layer. Here, the patterned conductive layer becomes the bit line 116 and the etching stopping insulating layer and the spacers form the insulating material 117 covering the bit line 116. Next, a third interlayer insulating layer 120 and an etch stopper 122 are sequentially formed on the semiconductor substrate 100 on which the bit line structures 118 are formed. The third interlayer insulating layer 120, like the first interlayer insulating layer 112, is formed of a silicon oxide-based insulating layer, and the etch stopper 122 is formed of a material having a different etching selectivity from that of the silicon oxide-based insulating layer of the third interlayer insulating layer 120, such as a silicon nitride (SiN) layer or a silicon nitrate (SiON) layer.

Figure 2B:
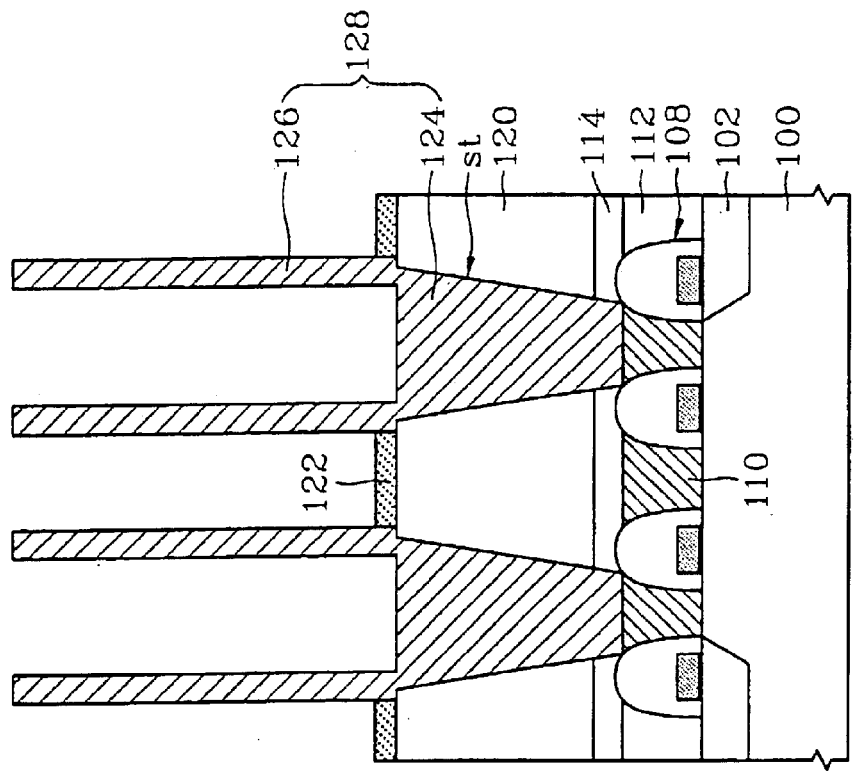

Referring to FIG. 2B, predetermined portions of the etch stopper 122 and the third and second interlayer insulating layers 120 and 114 are etched to expose the contact plugs 110 to be electrically contacted with capacitors to be formed later, and then storage node contact holes st are formed. At this time, the etch stopper 122 prevents misalignment from occurring during the formation of the storage node contact holes. Next, a conductive layer is deposited on the semiconductor substrate 100 so as to sufficiently fill the storage node contact holes and then is chemically and mechanically polished, thereby forming storage node contact plugs 124 in the storage node contact holes. Next, cylindrical storage node electrodes 126 are formed in electrical contact with the storage node contact plugs 124 by using a well-known method. Hereinafter, structures each comprised of one of the storage node contact plugs 124 and one of the storage node electrodes 126 will be referred to as lower electrodes 128. Here, the second interlayer insulating layer 114, the third interlayer insulating layer 120, and the etch stopper 122 exist between the adjacent lower electrodes 128.

Figure 2C:
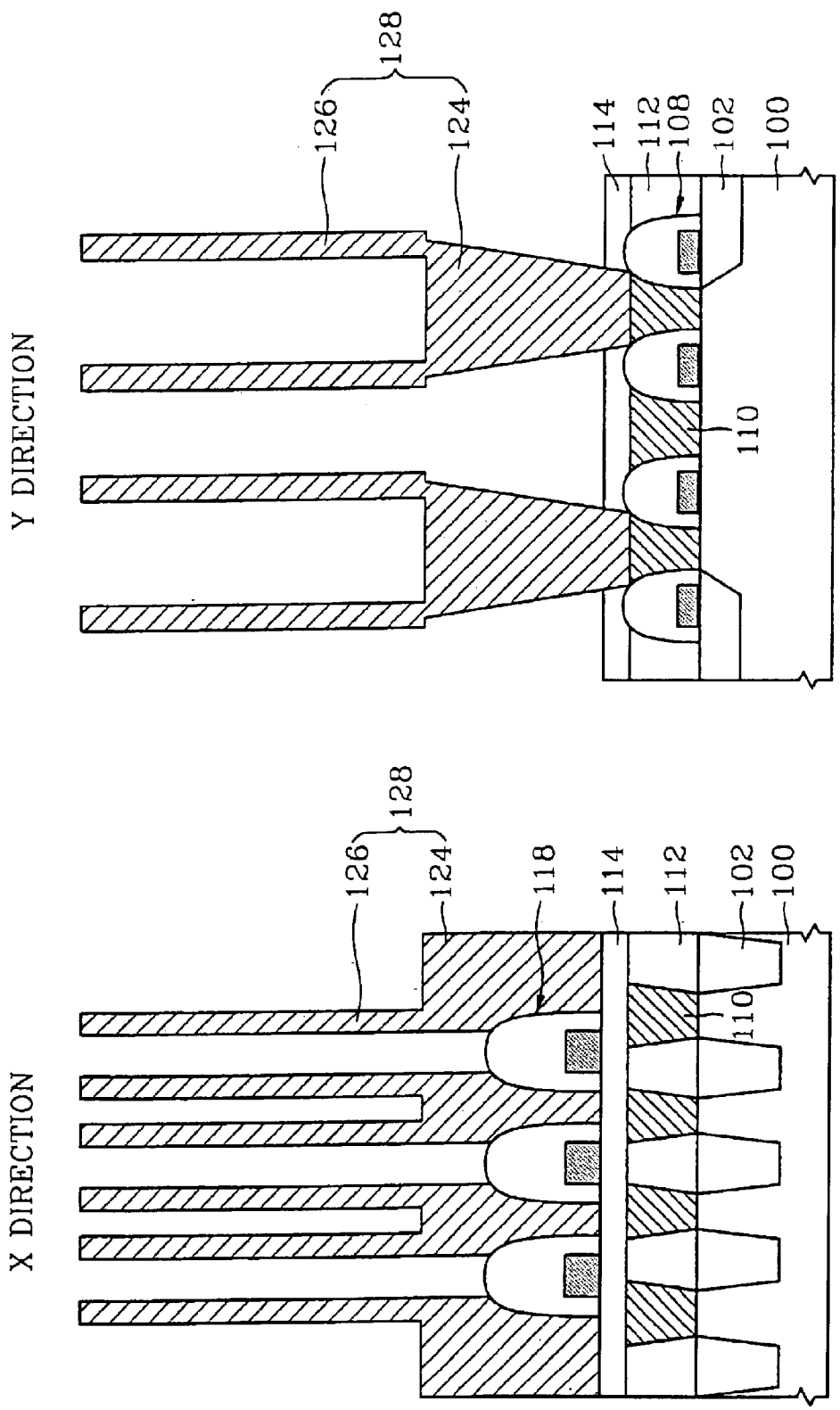

Referring to FIG. 2C, the etch stopper 122 of FIG. 2B existing between the adjacent lower electrodes 128, each of which includes one of the storage node contact plugs 124 and one of the storage node electrodes 126, is selectively removed by a well-known method for removing a silicon nitride layer. Preferably, the etch stopper 122 between the adjacent lower electrodes 128 is selectively removed by a wet etching process without substantially affecting the lower electrodes 128. Removal of the etch stopper 122 exposes surfaces on upper portions of the storage node contact plugs 124. Since the material of the etch stopper 122 has a different etching selectivity from that of the silicon oxide layer of the third interlayer insulating layer 120, the etch stopper 122 can be selectively removed. Next, like the etch stopper 122 between the adjacent lower electrodes 128, the third interlayer insulating layer 120 between the lower electrodes 128 is removed by a wet etching process so as not to substantially affect the lower electrodes 128. Since the etch stopper 122 and the third interlayer insulating layer 120 existing between the lower electrodes 128 are removed, empty spaces are provided between the lower electrodes 128, and the upper and lower side surfaces of the storage node contact plugs 124 and the storage node electrodes 126 are partially exposed. The lower portions of the storage node contact plugs 124 are fit into spaces between the bit line structures 118, and thus the storage node contact plugs 124 are supported by the bit line structures 118.

Figure 2D:
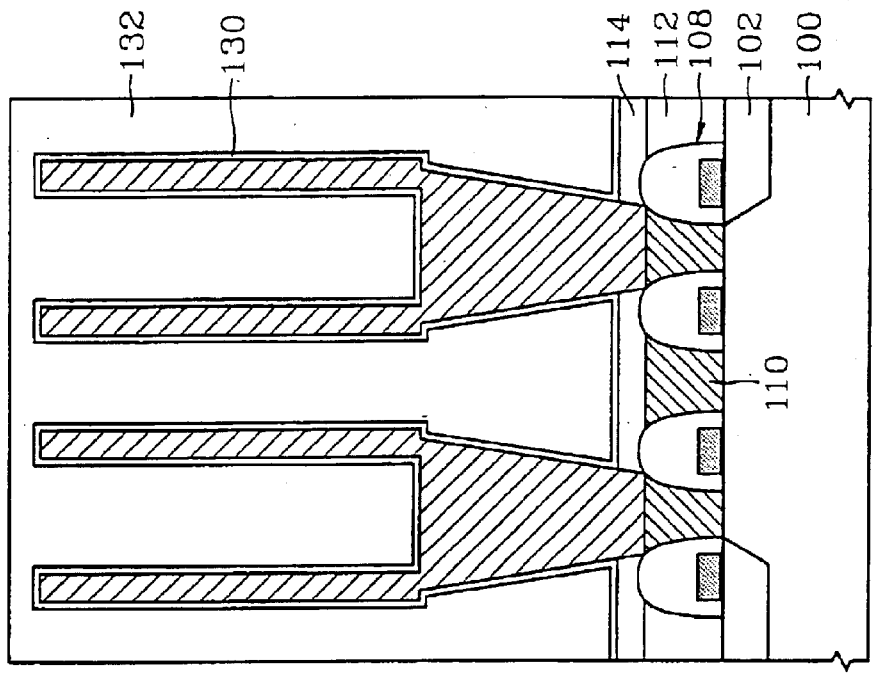
Figure 2D:
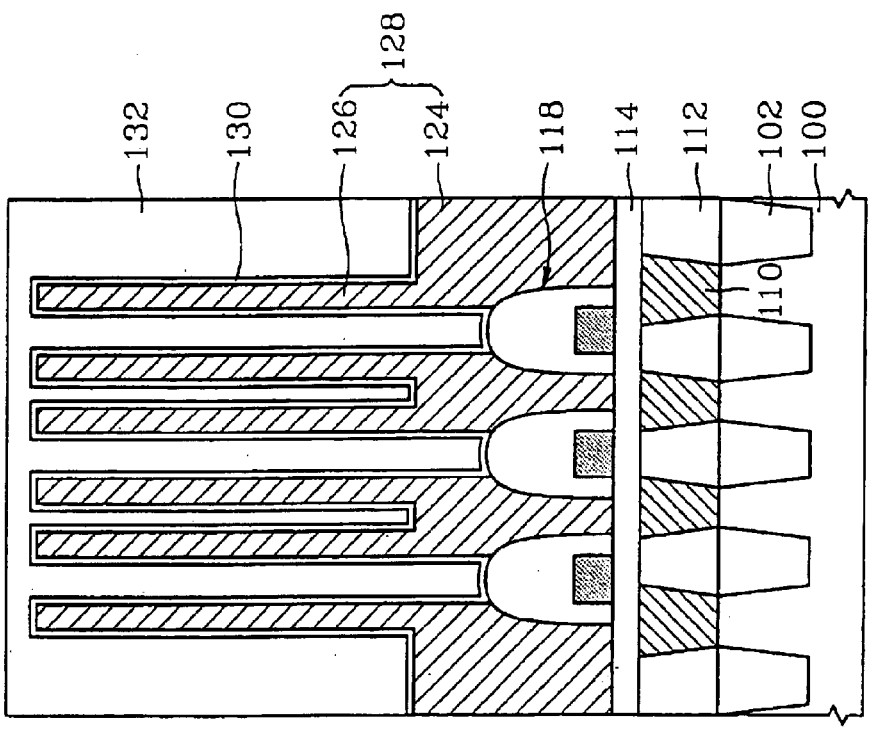

Referring to FIG. 2D, a dielectric layer 130 for a capacitor is deposited on the exposed lower electrodes 128 including the storage node electrodes 126 and the storage node contact plugs 124. The dielectric layer 130 may be formed of a nitride oxide (NO) layer or a tantalum oxide ($Ta_2O_5$) layer. Next, a plate electrode 132 is formed on the semiconductor substrate 100 on which the dielectric layer 130 is formed, thereby completing a capacitor.

Since the dielectric layer 130 for a capacitor covers the sides of the storage node contact plugs 124 as well as the storage node electrodes 126, the surface area of the lower electrodes 128 substantially increases. Accordingly, even if the height of the lower electrodes 128 is the same as the prior art, the capacitance of the capacitor increases considerably. In addition, the aspect ratio of a cell region and a step difference between the cell region and a peripheral region can be reduced.

As described above, according to the present invention, an etch stopper and an interlayer insulating layer existing between lower electrodes, each comprised of a storage node electrode and a storage node contact plug, are selectively removed. Next, a dielectric layer is deposited on the exposed surface of the lower electrodes, and then a plate electrode is formed.

Accordingly, since the dielectric layer for a capacitor covers the sides of the storage node contact plugs as well as the storage node electrodes, the surface area of the lower electrodes substantially increases. Accordingly, it is possible to obtain a high capacitance without increasing the height of the lower electrodes, and thus the aspect ratio of a cell region and a step difference between the cell region and a peripheral region can be reduced.

In addition, when removing the interlayer insulating layer existing between the lower electrodes, the etch stopper is simultaneously removed with the interlayer insulating layer. If the etch stopper is left in place, it can capture conductive etching resides and form a bridge between the lower electrodes. The etch stopper can also be sufficiently dense to hinder impurities contained in the interlayer insulating layer from outgassing during subsequent high temperature processes. When the etch stopper is formed of a silicon nitride layer, it can induce stress on adjacent semiconductor layers and cause deformation thereof. Removal of the etch stopper avoids these limitations.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. An integrated circuit memory device comprising:
   a semiconductor substrate;
   a plurality of word line structures on predetermined portions of the semiconductor substrate;
   word line contact plugs, each of which is disposed between adjacent word line structures;
   storage node contact plugs in electrical contact with predetermined ones of the word line contact plugs;
   storage node electrodes on the storage node contact plugs; and
   a plate electrode between the storage node electrodes and between the storage node contact plugs.

2. The integrated circuit memory device of claim 1, wherein the plate electrode extends between lower portions of the storage node contact plugs.

3. The integrated circuit memory device of claim 1, further comprising a plate insulating layer between the plate electrode and the storage node contact plugs that insulates the plate electrode from the storage node contact plugs.

4. The integrated circuit memory device of claim 1, wherein the storage node electrodes are directly on the storage node contact plugs.

5. The integrated circuit memory device of claim 1, wherein the word line structures each comprise a gate electrode, a gate insulating layer insulating the gate electrode from the semiconductor substrate, and an insulating material covering a top surface and sides of the gate electrode.

6. An integrated circuit memory device, comprising:
   a semiconductor substrate;
   a pair of spaced apart word line structures on the substrate;
   an interlayer insulating layer on the word line structures;
   a bit line structure on the interlayer insulating layer that is transverse to the word line structures;
   a first capacitor electrode that extends from the substrate between adjacent word line structures, through the interlayer insulation layer, and beyond the bit line structure;
   a capacitor dielectric on the first capacitor electrode and directly on the bit line structure; and
   a second capacitor electrode on the capacitor dielectric.

7. The memory device according to claim 6, wherein the capacitor dielectric is directly on the interlayer insulation layer.

8. An integrated circuit memory device comprising:
   a semiconductor substrate;
   a plurality of word line structures on predetermined portions of the semiconductor substrate;
   word line contact plugs between adjacent word line structures;
   bit line structures in electrical contact with a first set of the word line contact plugs;
   storage node contact plugs on, and electrically connected to, a second set of the word line contact plugs that is different from the first set of the word line contact plugs;
   storage node electrodes on the storage node contact plugs;
   a dielectric layer on the storage node contact plugs and the storage node electrodes; and
   a plate electrode on the dielectric layer and between the storage node contact plugs and between the storage node electrodes.

9. The integrated circuit memory device of claim 8, wherein the plate electrode is between lower portions of the storage node contact plugs.

10. The integrated circuit memory device of claim 8, wherein the storage node contact plugs are directly on the second set of the word line contact plugs.

11. The integrated circuit memory device of claim 8, wherein the storage node contact plugs are directly on the bit line structures.

12. The integrated circuit memory device of claim 8, wherein the storage node electrodes are directly on the storage node contact plugs.

13. The integrated circuit memory device of claim 8, wherein the dielectric layer is directly on the bit line structures.

14. The integrated circuit memory device of claim 8, wherein:
   the word line structures each comprise a gate electrode, a gate insulating layer which insulates the gate electrode from the semiconductor substrate, and an insulating material on a top surface and sides of the gate electrode, and
   the bit line structures each comprise a bit line and a dielectric layer on a top surface and sides of the bit line.

* * * * *